US005343022A

United States Patent [19]

Gilbert, Sr. et al.

[11] Patent Number: 5,343,022

[45] Date of Patent: Aug. 30, 1994

[54] PYROLYTIC BORON NITRIDE HEATING UNIT

[75] Inventors: Michael H. Gilbert, Sr., North Olmsted; Timothy J. Hejl, Parma, both of Ohio

[73] Assignee: Advanced Ceramics Corporation, Lakewood, Ohio

[21] Appl. No.: 953,156

[22] Filed: Sep. 29, 1992

[51] Int. Cl.[5] .......................... C23C 14/00; H05B 3/10

[52] U.S. Cl. .................................... 219/552; 118/725; 118/726; 392/389

[58] Field of Search ............... 219/541, 552, 553, 543, 219/544; 392/389; 118/725, 726, 727; 361/234

[56] References Cited

U.S. PATENT DOCUMENTS

| | | | |
|---|---|---|---|
| 1,528,388 | 3/1925 | Speiers | 338/224 |
| 2,640,861 | 6/1953 | Kremers | 219/552 |
| 3,637,980 | 1/1972 | Fox et al. | 392/389 |
| 4,164,646 | 8/1979 | Grise | 219/514 |
| 4,264,803 | 4/1981 | Shinko | 392/389 |
| 4,755,658 | 7/1988 | Wilsey | 219/541 |
| 4,927,994 | 5/1990 | Leger | 219/553 |
| 5,031,229 | 7/1991 | Chow | 392/389 |
| 5,059,770 | 10/1991 | Mahawili | 219/391 |
| 5,155,652 | 10/1992 | Logan et al. | 361/234 |
| 5,233,165 | 8/1993 | Maumus et al. | 219/553 |

FOREIGN PATENT DOCUMENTS

| | | | |
|---|---|---|---|
| 2402111 | 7/1975 | Fed. Rep. of Germany | 118/726 |
| 2654606 | 6/1978 | Fed. Rep. of Germany | 118/726 |
| 2627658 | 8/1989 | France . | |

OTHER PUBLICATIONS

Patent Abstracts of Japan vol. 16, No. 200 (E-1201) May 13, 1992 and JP.A. 04 032 182 (Toshiba Lighting & Technol Corp.) Feb. 4, 1992.

*Primary Examiner*—Geoffrey S. Evans
*Attorney, Agent, or Firm*—Eugene Lieberstein; Michael N. Meller

[57] ABSTRACT

A pyrolytic boron nitride heating unit composed of a dielectric base of boron nitride and a pyrolytic graphite heating element having contact ends for connection to an external power supply through a contact assembly comprising graphite posts connected to the contact ends with each post having a pyrolytic boron nitride coating and exposed attachment ends spaced a predetermined minimum distance from the contact ends for connection to the power supply. The contact assembly preferably also includes flexible graphite washers for connection between the contact ends and the graphite posts.

5 Claims, 2 Drawing Sheets

Fig. 3
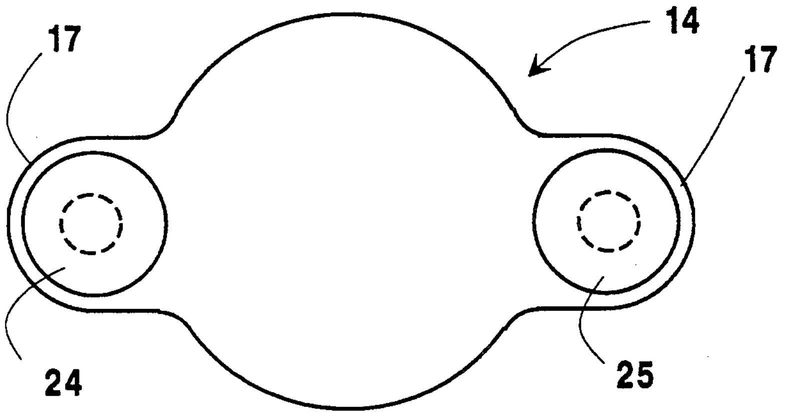
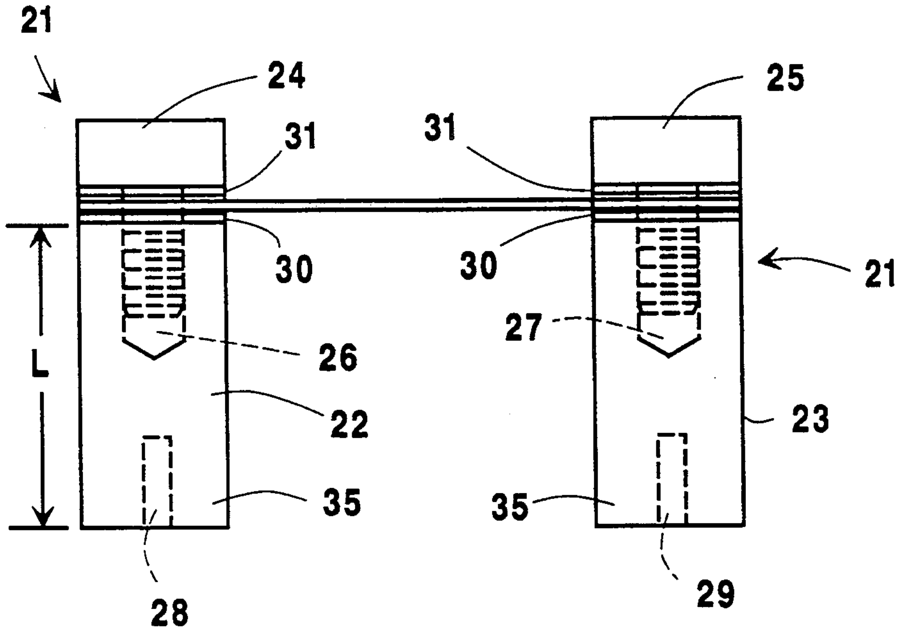
Fig. 2

PYROLYTIC BORON NITRIDE HEATING UNIT

This invention relates to a pyrolytic boron nitride heating unit and more particularly to an electrical contact assembly for a boron nitride heating unit.

BACKGROUND OF THE INVENTION

Pyrolytic boron nitride (PBN) is formed by chemical vapor deposition of boron nitride in a reactor chamber by the vapor phase reaction of ammonia and a boron containing gas such as boron trichloride ($BCl_3$) as is more specifically described in U.S. Pat. No. 3,152,006 which is incorporated herein by reference. The pyrolytic boron nitride is of very high purity and when separated or released from the substrate forms a self standing article of purified pyrolytic boron nitride.

A pyrolytic boron nitride heating unit includes a dielectric base of boron nitride and a heating element formed from a conductive material capable of resistive heating such as graphite and more particularly pyrolytic graphite. The heating element is connected to an external power supply to form a resistive heater. A pyrolytic boron nitride heating unit is used for resistive heating in a variety of system applications such as molecular beam epitaxy, space experiments, substrate heaters for electron microscopy and in the growth of superconducting films. In certain applications such as in the growth of superconducting films, it is necessary to introduce oxygen into the atmosphere of the reacting chamber in which the superconducting film is grown. The oxygen in the atmosphere will react with the graphite conductor in the heating unit to oxidize the conductor causing an open circuit. Existing electrical contacts for pyrolytic boron nitride heating units rely on a screw or clamp to press against the pyrolytic graphite conductor. This type of contact arrangement is not impermeable to a reactive gas and if the temperature at the point of contact with the graphite heating element is high enough such as 400° C. oxidation will occur. In addition thermal stress can cause the screw or clamp to lose pressure at the point of contact which may cause arcing at the contact terminal and damage the heating unit.

Various methods have been attempted in the prior art to protect the electrical contact area from oxidation. One approach is to use a platinum coating to form a barrier between the pyrolytic graphite and the oxidizing atmosphere. In the extreme some users have operated the heating unit with a quartz envelop to protect the heating element from the oxidizing atmosphere. In other applications, the thermal stress of the installation can cause an arc at the point of electrical contact with the heating element which will damage the heating unit and render it nonfunctional.

SUMMARY OF THE INVENTION

The pyrolytic boron nitride heating unit of the present invention uses a contact assembly to connect the heating unit to an external source of power and to provide a barrier between the conductive graphite heating element and any reactive gas environment. Broadly, the pyrolytic boron nitride heating unit of the present invention comprises a dielectric base of boron nitride, a heating element of pyrolytic graphite superimposed upon said base and arranged in a serpentine pattern with said heating element having a pair of contact ends for providing a series electrical path through the contact ends of said pyrolytic graphite heating element and a contact assembly for connecting said contact ends to an external power supply, said contact assembly comprising a graphite post for each contact end of said heating element with each graphite post being attached at one end to the corresponding contact end of said heating element and having an opposite end spaced a predetermined distance from said one end for attachment to said external power supply and a pyrolytic boron nitride coating covering each graphite post except at the attachment ends thereof.

BRIEF DESCRIPTION OF THE DRAWINGS

Other advantages and objects of the present invention will become apparent from the following detailed description thereof when read in conjunction with the accompanying drawings of which:

FIG. 2 is a side elevation of the pryolytic heating unit of the present invention; and FIG. 3 is a plan view of the pryolytic heating unit of FIG. 2.

DETAILED DESCRIPTION OF THE PREFERRED EMBODIMENT

Figure 1A:
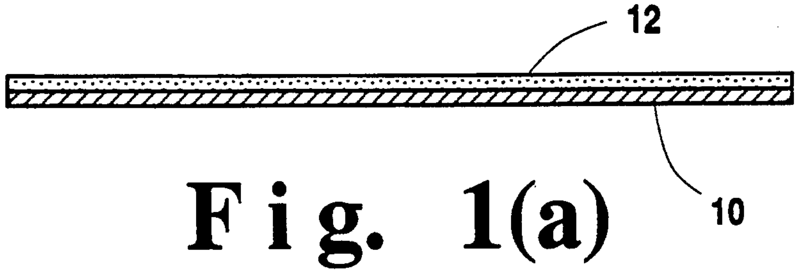
FIGS. 1(*a*), (*b*), (*c*) illustrate the sequence of steps used in fabricating a pryolytic heating element in accordance with the preferred embodiment of the present invention.
Figure 1B:
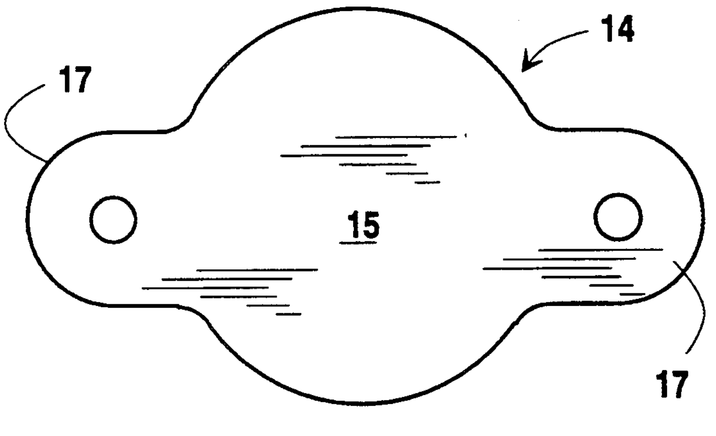
Figure 1C:
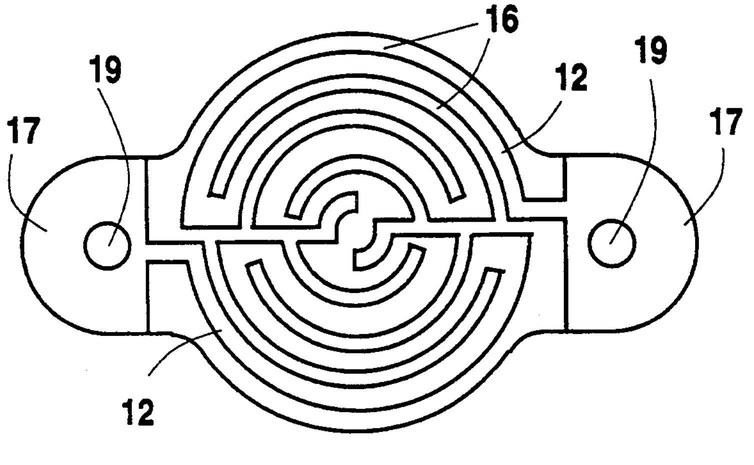

The sequence of steps for fabricating a pyrolytic boron nitride heating element in accordance with the present invention is illustrated in FIG. 1 (*a*)–(*c*). A pyrolytic boron nitride base plate 10 as shown in FIG. 1(*a*) having any desired thickness of generally between 0.030 to 0.050 inches is coated with a layer of pyrolytic graphite 12 to assure an intimate and uniformly thin graphite deposit as shown in FIG. 1(*b*). The term pyrolytic graphite is hereby defined to mean a crystalline carbonaceous structure in which there is a high degree of crystallite orientation. Crystallite orientation is not found in common graphite materials. Additionally, pyrolytic graphite exhibits anisotropic physical properties due to its being characterized by oriented slip planes in contrast to isotropic properties of common graphite. Pyrolytic graphite may be formed by chemical vapor decomposition of, for example, methane gas at high temperature in a reactor chamber with a suitable inert diluent.

The coated base plate 10 is then machined into a heating element 14 as shown in FIG. 1(*b*) having a thin wafer like body 15 of substantially circular cross section and two tabs 17 extending from the body 15. A serpentine pattern of grooves 16 as shown in FIG. 1(*c*) are machined through the graphite layer 12 to expose the underlying boron nitride plate 10 for forming a continuous strip of pyrolytic graphite 12 extending from the tabs 17 in an electrical series circuit relationship. Holes 19 are drilled through the tabs 17 for attaching the post connectors 21 as shown in FIGS. 2 and 3.

The post connectors 21 include graphite posts 22 and 23 and graphite screws 24 and 25. The graphite posts have threaded holes 26 and 27 at one end to receive the screws 24 and 25 and have an internal tapped hole 28 and 29 at the opposite end for attachment to an external power supply (not shown). A pair of flexible graphite washers 30 and 31 are preferably used with each post connector 21 and are placed on opposite sides of each tab 17 to provide a solid physical and electrical attachment between each post connector 21 and the heating element 14. Flexible graphite is made from particles of graphite intercalated in an acid solution and exfoliated as taught in U.S. Pat. No. 3,404,061 the disclosure of which is herein incorporated by reference. The posts 22 and 23 are of a length L sufficient to separate the point of electrical contact between the heating element 14 and the external power supply such that the temperature at the ends 35 of the posts 22 and 23 where attachment is made with the power supply is substantially below the temperature at the surface of the heating element 14. A length L of between 1–3 inches is acceptable. The assembled heating element 14 and post connectors 21 are then preferably coated with a pyrolytic boron nitride layer to encapsulate the heating element 14 and post connectors 21 with the exception of the tapped holes 28 and 29 which are left uncoated for attachment to the external power supply. Alternatively, the contact ends 35 of the post connectors 21 may be masked to provide an alternative connection to the power supply.

What we claim is:

1. A pyrolytic boron nitride heating unit for use in a reactive atmosphere comprising a dielectric base of boron nitride, a heating element of pyrolytic graphite superimposed upon said base and arranged in a serpentine pattern with said heating element having a pair of contact ends for providing a series electrical path through said pyrolytic graphite between the contact ends thereof and a contact assembly for connecting said contact ends to an external power supply with said contact assembly comprising a graphite post for each contact end of said heating element with one end of said graphite post attached to a corresponding contact end of said heating element and having an opposite end spaced a predetermined distance from said one end for attachment to said external power supply and a pyrolytic boron nitride coating encapsulating said heating element and covering each graphite post so as to form an integral pyrolytic boron nitride covering except at the ends of said graphite posts for attachment to said external power supply.

2. A pyrolytic boron nitride heating unit as defined in claim 1 wherein each contact end of said heating element has an opening for attachment to said graphite post.

3. A pyrolytic boron nitride heating unit as defined in claim 2 further comprising flexible graphite washers for use between each contact end of said heating element and each graphite post.

4. A pyrolytic boron nitride heating unit as defined in claim 3 wherein said contact assembly further comprises a graphite screw for each graphite post with each graphite post having a corresponding threaded opening to receive the graphite screw.

5. A pyrolytic boron nitride heating unit as defined in claim 4 wherein each graphite post is of a length of between 1 to 3 inches.

* * * * *